Sept. 8, 1959

H. J. McGARVEY 2,903,627

MOUNTING FOR ELECTRIC CIRCUIT COMPONENTS
AND PRINTED CIRCUIT UNIT

Filed March 29, 1957

INVENTOR
HAROLD J. McGARVEY

BY

Emery, Whittemore, Sandoe & Dix
ATTORNEYS

United States Patent Office 2,903,627

Patented Sept. 8, 1959

2,903,627

MOUNTING FOR ELECTRIC CIRCUIT COMPONENTS AND PRINTED CIRCUIT UNIT

Harold J. McGarvey, Du Bois, Pa., assignor to Speer Carbon Company, St. Marys, Pa., a corporation of New York Application March 29, 1957, Serial No. 649,380

9 Claims. (Cl. 317—101)

This invention relates to mountings for electric circuit components, and more particularly to printed circuit units and boards having improved mounting means for holding electronic components such as resistors, capacitors and inductors in place thereon during the assembling and soldering operations.

As the size of electronic circuit components is reduced, and the use of printed circuits increases, it becomes more desirable to change from the use of components which have flexible wire or other terminals extending therefrom to the use of what are known as leadless type components. These leadless components have spaced surface areas of a high electrical conductivity solder-adherent material which can be soldered directly to circuit leads which have been formed by any of the known procedures right on a dielectric base or board. Since leadless components have no wire leads that can be used to hold them in assembled position on the board, it is necessary to resort to other means for holding the parts in assembled position until they are soldered. Metal clip arrangements often are used to hold these components in place on the surface of a board during the assembly operation, and dip soldering commonly is utilized to make all, or at least many, of the soldered connections on a board at the same time. Use of such clips adds to the cost of the unit and there are other objections.

It is an object of this invention to provide an improved mounting for electric circuit components such as resistors, capacitors and inductors. It is another object of the invention to provide new and improved means for holding such components in place on a board during the assembling and soldering operations. It also is an object of the invention to provide improved printed circuit units and boards. A further object of the invention is to provide a printed circuit unit or board in which the components are located in openings extending through the insulating base, thus insuring a thinner, more compact article. Other objects and advantages of the invention will be pointed out, or will become apparent, as the description of the invention proceeds.

A preferred embodiment of the invention selected for purposes of illustration and description is shown in the accompanying drawings, wherein:

Figure 1 is a view of a segment of an insulating board showing, to enlarged scale, how an electronic component may be mounted thereon;

Figures 2 and 3 are sectional views taken substantially on the lines 2—2 and 3—3, respectively, as shown on Figure 1;

Figure 1:
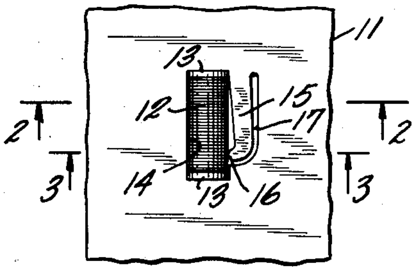
Figure 2:
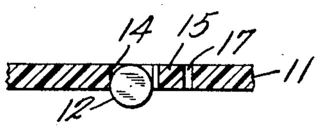
Figure 3:
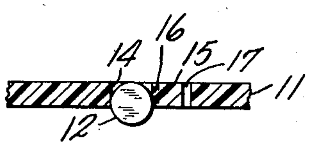

Referring first to Figures 1–3 of the drawings, 11 represents a segment of an insulating base or board on which is located an electronic circuit component 12. In the illustration this component is a cylindrical body, but it may have other shapes. It may be, for example, a resistor, capacitor, or inductor. In the illustrative embodiment the end portions 13 of the component are formed of, or coated with, high electrical conductivity solder-adherent material comprising the terminals by which the component is to be connected in an electrical circuit. For the purpose of better disclosing the invention, the component is shown substantially enlarged as compared to many components presently used in printed electronic circuit units. For simplicity in describing the invention, a single component is shown in the illustration of Figures 1–3, but a circuit unit ordinarily would contain a plurality of such components, possibly running to 25 or 30, or even more in a complex electric circuit.

The insulating base 11 has an opening 14 therethrough which conforms generally in shape to the contour of the component 12. Preferably this opening will be formed by punching, and in a printed circuit unit the punching may be done at the same time that other openings are punched and simultaneously with the trimming of the board. The dimensions of the electronic components will vary within specified tolerances. Even if the permissible tolerance range is narrow, it will be appreciated that the opening in the board must be large enough to receive the largest component, and that smaller components will fit such opening loosely. Moreover, there will be slight variations in the size of the openings which are punched in the board to receive the components. It is impracticable, if not impossible, to operate at such close dimensional tolerances for both the components and the punched openings that every component could be readily inserted in any punched opening, and that at the same time all components would fit all punched openings with a good frictional engagement which could be depended on to hold the components securely in place in the openings during the assembly operation and up to and through the soldering operation.

The present invention overcomes this problem by making the opening 14 large enough so that an opening which has the minimum dimensional tolerances will receive a component which has the maximum dimensional tolerances. A portion of the wall of the opening is made in the form of a finger which presses resiliently against the side of a component inserted in the opening to hold the component in place. This finger 15 extends generally parallel to the side of the opening and is an integral part of the base 11, being connected at one end only to the base. The other end of the finger projects slightly into the opening which is to be occupied by a component and is provided with a protrudent limited contact area 16 which will engage the wall of the component. This protrudent contact area is not an electric contact, but is that portion of the finger which engages the wall of the component with a resilient frictional contact.

An open space 17 is formed in the dielectric base in back of the finger 15 to permit the finger to be pressed resiliently rearwardly when a component is introduced into the opening and engages the contact area 16 on the projection end of the finger. Only slight pressure is required to press the component into the opening, where it will be held against movement by the resilient pressure of the finger while other components, connections and parts are secured on the board, and thereafter while the soldered connections are made.

As will be evident from inspection of Figures 2 and 3, the thickness of the completed printed circuit board is reduced by reason of the fact that the circuit components are located in openings through the base, as distinguished from the usual practice in which the components rest against one surface of the base, or are held in clips secured on the base, or even are held spaced away from such surface by their leads. A more compact construction is provided by this invention, and one which is neater and cleaner in appearance. There is less likelihood of components being raked off accidentally prior to the soldering operation, and of damaging other circuit boards with which they may come in contact.

No definite relation between the thickness of the insulating base and the diameter or thickness of the component is essential, except that the protrudent contact area on the finger should not engage a component surface of such curve or slope as to tend, by camming action, to force the component out of the opening. It will be evident that the punched insulating base can be laid on a flat surface and that all of the circuit components can then be inserted into the openings from above, either manually or by machine. With such an arrangement, no part of the components or their leads will project beyond the bottom surface of the base.

Figure 4:
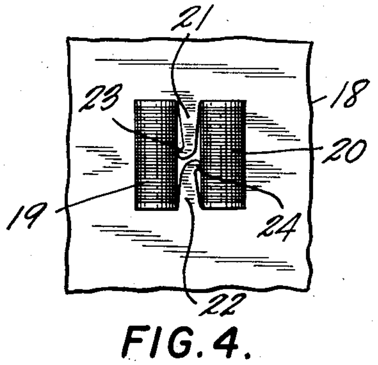
Figure 4 is a view similar to Figure 1, but showing how two closely spaced components may be mounted.

Figure 4 shows a modified arrangement for mounting two circuit components in close relation to each other. The insulating base or board 18 has two parallel openings therethrough to receive the circuit components 19 and 20. The narrow strip of the base separating the openings for the two components is punched in the form of two fingers 21 and 22 which are arranged substantially end to end and connected integrally to the base adjacent the ends of the components. The finger 21 has a protrudent contact area 23 which presses against the side of the component 19, and the finger 22 has a protrudent contact area 24 which presses in the opposite direction against the side of the component 20. As may be seen in Figure 4, each of these fingers has an open space opposite the protrudent contact area into which the finger can move rearwardly as the component is pressed into the opening and engages the protrudent contact area. Although the two components 19 and 20 are arranged in close proximity to each other, they are independently held on the board by their respective fingers.

Figure 5:
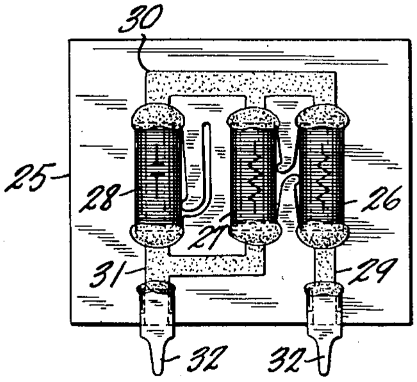
Figure 5 is a printed circuit board having three circuit components mounted therein, these components being connected by printed wiring and soldered connections into one particular circuit and also to terminals secured to and projecting from an edge of the board.

Figure 5 shows an example of a printed circuit board. This board may be made by being punched from a copper clad phenolic sheet, and by having excess copper removed to leave the desired conducting circuit pattern. The openings for the components which are to comprise the electric circuit desirably will be punched in the board at the same time the board is punched from a larger sheet, or trimmed to size, but this may be done as a separate operation. These openings for the components will be formed with component holding fingers integral with the base, in the manner illustrated in Figures 1 or 4, or both.

Figure 6:
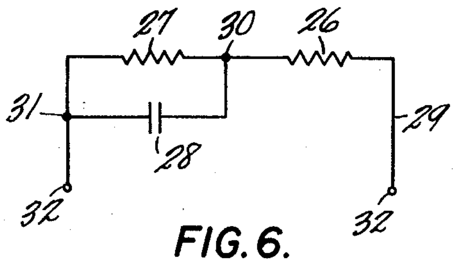
Figure 6 is the schematic wiring diagram for the particular printed circuit board which is shown in Figure 5.

In the illustrative embodiment of Figure 5 the board 25 has mounted thereon two resistors 26 and 27 and a capacitor 28, which are connected by soldered connections to the conducting circuit pattern 29, 30, 31. Portions 29 and 31 of this conducting circuit pattern extend to one edge of the circuit board to conducting terminals 32. These terminals 32 are secured to the board and, in the illustration, extend beyond the edge thereof for conveniently making external electrical connections to the unit. A schematic wiring diagram for the printed circuit board shown in Figure 5, which is merely illustrative, is shown in Figure 6.

After a circuit board unit has been completed to the stage shown in Figure 5, the circuit may be protected against mechanical damage and atmospheric effect by being encased in insulating material, leaving only the terminals 32 exposed. This may be done, for example, by dip coating with a plastic insulating material such as a Durez phenol-formaldehyde resin. The schematic wiring diagram and the manufacturer's identification may then be printed directly on the insulating jacket.

The present invention is not restricted to use with printed circuit boards, or to use with such boards made by any particular process. The invention may be variously modified and embodied within the scope of the subjoined claims.

I claim:

1. A board for an electric circuit unit comprising a dielectric base, an opening through the base conforming generally in shape to the contour of an electric component which is to be mounted on the base and form a part of the electric circuit, a portion of the wall of the said opening being in the form of a finger lying within the plane of the base and extending generally parallel to the side of the opening and integrally connected at one end only to the dielectric base, the other end of the finger projecting inwardly of the aforesaid opening a short distance so that it will engage a portion of the periphery of a component when such component is introduced into the opening, and an open space in the dielectric base in back of the finger to permit the finger to be pressed resiliently rearwardly when a component is introduced into the aforesaid opening and engages the projecting end of the finger.

2. A board for an electric circuit unit as in claim 1, in which the end of the finger that projects inwardly of the opening has a protrudent limited contact area for engaging the component.

3. A board for an electric circuit unit as in claim 1, in which the dielectric base has a conducting circuit pattern on at least one surface thereof, and in which the conducting circuit pattern extends to the edge of the opening at a location which will be adjacent to a terminal of the component when a component is inserted in the opening.

4. A board for an electric circuit unit as in claim 3, in which the conducting circuit pattern also extends to the edge of the dielectric base, and in which at such place there is a conducting terminal secured to the dielectric base and extending beyond the edge thereof.

5. A mounting for a leadless electric circuit component such as a resistor, capacitor, or inductor, comprising, in combination, an insulating board having an opening therethrough conforming generally in shape to the contour of the component which is to be mounted, the opening being large enough to receive the component, and an integral resilient finger lying within the plane of the base and projecting inwardly from the edge of the opening adapted to engage frictionally a portion of the periphery of a component, when such component is inserted in the opening, to secure such component in place in the opening.

6. A mounting as in claim 5, in which the insulating board has a conducting circuit pattern on at least one surface thereof, and in which the conducting circuit pattern extends to the edge of the opening at a location which will be adjacent to a terminal of the component when a component is inserted in the opening.

7. A printed circuit unit comprising a dielectric base, an opening through the dielectric base conforming generally in shape to the contour of a circuit component which is to be mounted in the base and form a part of the printed circuit unit, the said opening being large enough to receive the component, and an integral resilient finger projecting from the edge of the opening inwardly, and lying between the two surface planes of the base, to engage a portion of the periphery of a component frictionally when such component is inserted in the opening.

8. A printed circuit unit comprising, in combination, a dielectric base, an opening through the dielectric base, circuit leads on the dielectric base extending to portions of said opening, a circuit component having spaced surface areas of a high electrical conductivity solder-adherent material, the component being mounted in said opening with the areas of high electrical conductivity adjacent the circuit leads on said dielectric base, an integral resilient finger projecting from the side wall of the opening into the opening and frictionally engaging a portion of the periphery of the component to secure the component in the opening, and soldered connections between the said circuit leads and the areas of high electrical conductivity on the components at the points where they are adjacent to each other.

9. A printed circuit unit comprising, in combination, a dielectric base, a plurality of openings through the dielectric base for receiving electric circuit components, a conducting circuit pattern on at least one surface of the dielectric base which extends to the edges of the openings at locations which will be adjacent to terminals of components when such components are inserted therein, electric circuit components having spaced surface areas of a high electrical conductivity solder-adherent material, these components being located in the aforesaid openings, an integral resilient finger projecting from the side wall of each such opening into the opening and frictionally engaging the component to secure it in the opening, and soldered connections between the said conducting circuit pattern and the areas of high electrical conductivity on the components at the points where they are adjacent to each other.

References Cited in the file of this patent

UNITED STATES PATENTS

| | | |
|---|---|---|
| 2,443,449 | Fry | June 15, 1948 |
| 2,755,048 | Warsher | July 17, 1956 |
| 2,769,119 | Martin | Oct. 30, 1956 |